(12) United States Patent
Adkisson et al.

(10) Patent No.: US 8,106,432 B2
(45) Date of Patent: Jan. 31, 2012

(54) CMOS IMAGER PHOTODIODE WITH ENHANCED CAPACITANCE

(75) Inventors: James W. Adkisson, Jericho, VT (US); John J. Ellis-Monaghan, Grand Isle, VT (US); Mark D. Jaffe, Shelburne, VT (US); Dale J. Pearson, Bedford Hills, NY (US); Dennis L. Rogers, Carmel, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/634,898

(22) Filed: Dec. 10, 2009

(65) Prior Publication Data

US 2010/0084690 A1    Apr. 8, 2010

Related U.S. Application Data

(62) Division of application No. 11/276,085, filed on Feb. 14, 2006, now Pat. No. 7,659,564.

(51) Int. Cl.
*H01L 31/04* (2006.01)
(52) U.S. Cl. .......... 257/293; 257/E27.133; 257/E31.038
(58) Field of Classification Search .......... 257/290–294, 257/E27.133, E31.038
See application file for complete search history.

(56) References Cited

U.S. PATENT DOCUMENTS

| | | | |
|---|---|---|---|
| 4,984,047 A * | 1/1991 | Stevens | ........................ 257/223 |
| 6,232,626 B1 | 5/2001 | Rhodes | |
| 6,465,846 B1 | 10/2002 | Osanai | |
| 6,500,692 B1 | 12/2002 | Rhodes | |
| 6,611,037 B1 | 8/2003 | Rhodes | |
| 6,707,075 B1 | 3/2004 | Rogers et al. | |
| 6,723,580 B2 * | 4/2004 | Park | ............................... 438/57 |
| 6,730,980 B2 | 5/2004 | Rhodes | |
| 6,767,759 B2 | 7/2004 | Rhodes | |
| 6,838,742 B2 | 1/2005 | Rhodes | |
| 2001/0032979 A1 | 10/2001 | Rhodes | |
| 2003/0089929 A1 | 5/2003 | Rhodes | |
| 2004/0195600 A1 | 10/2004 | Rhodes | |
| 2004/0227061 A1 | 11/2004 | Clevenger et al. | |
| 2004/0235216 A1 | 11/2004 | Rhodes | |
| 2005/0093038 A1 | 5/2005 | Rhodes | |
| 2006/0081900 A1 * | 4/2006 | Baggenstoss | ................. 257/292 |

FOREIGN PATENT DOCUMENTS

KR    1020050039167    4/2005

* cited by examiner

*Primary Examiner* — Colleen Matthews
(74) *Attorney, Agent, or Firm* — Scully, Scott, Murphy & Presser, P.C.; Anthony Canale

(57) ABSTRACT

A pixel sensor cell having a semiconductor substrate having a surface; a photosensitive element formed in a substrate having a non-laterally disposed charge collection region entirely isolated from a physical boundary including the substrate surface. The photosensitive element comprises a trench having sidewalls formed in the substrate of a first conductivity type material; a first doped layer of a second conductivity type material formed adjacent to at least one of the sidewalls; and a second doped layer of the first conductivity type material formed between the first doped layer and the at least one trench sidewall and formed at a surface of the substrate, the second doped layer isolating the first doped layer from the at least one trench sidewall and the substrate surface. In a further embodiment, an additional photosensitive element is provided that includes a laterally disposed charge collection region that contacts the non-laterally disposed charge collection region of the photosensitive element and underlies the doped layer formed at the substrate surface.

13 Claims, 7 Drawing Sheets

CMOS IMAGER PHOTODIODE WITH ENHANCED CAPACITANCE

CROSS REFERENCE TO RELATED APPLICATIONS

This application is a divisional application of U.S. Ser. No. 11/276,085, filed on Feb. 14, 2006. The entire contents of the aforementioned U.S. application are incorporated herein by reference.

BACKGROUND

The present invention relates to semiconductor optical image sensors, and particularly, to a novel CMOS (complementary metal oxide semiconductor) image sensor photodiode structure having a deep trench with a diode all along its sidewall to increase the capacitance of the structure without increasing the area of the cell. This trench structure can be designed in such a way that the trench will be fully depleted during the reset phase of operation and can hold a larger charge due to its larger capacitance than a conventional photodiode.

DESCRIPTION OF THE PRIOR ART

CMOS image sensors are now replacing conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

As the pixel size in CMOS imagers continue to scale down, to reduce costs, several problems arise: First, the smaller area reduces the total amount of electrons that can be stored in a given cell due to the reduced cell capacitance. Second, the smaller area increases the crosstalk between cells because electron diffusion is primarily responsible for the transport of the electrons from deep into the substrate to the surface photodiode. Third, the signal to noise ratio degrades because of a smaller number of electrons that are being measured and the noise sources (which primarily come from the periphery of the photodiode and its support circuits) that have not scaled. Current trench-type CMOS imager photosensor devices are described in U.S. Pat. Nos. 6,232,626; 6,500,692; 2004/0195600 and additionally, U.S. Pat. Nos. 6,611,037; 6,767,759; 6,730,980 and 6,838,742.

FIG. 1 depicts a typical photosensor cell 10 having a trench-type configuration such as shown in prior art U.S. Pat. No. 6,232,626. As shown in FIG. 1, photosensor cell 10 is formed on a semiconductor substrate that includes an epitaxial layer or well surface layer 15 of a first conductivity type, e.g., p-doped. The photosensor cell 10 includes an overlying conductive layer 18 that is transparent to radiant energy and may comprise polysilicon. An insulating layer 22 formed of a suitable material, e.g., $SiO_2$, is formed between the conductive layer 18 and underlying doped diffusion region 20. Element 25 comprises a transfer gate and includes diffusion regions 20 and 30 doped with material of a second conductivity type, e.g., n-doped. According to the prior art, the doped diffusion regions 20 and 30 are performed by ion implantation. The diffusion region 30 that is a floating diffusion region of the second conductivity-type serves as the source for a further reset transistor (not shown). The combined n-doped diffusion region 20 and p-type substrate 15 comprises a photodiode sensor for converting the photon energy into accumulating image charge for the photosensor cell pixel 10.

The charge transfer transistor gate 25 is shown surrounded by thin spacer structures 23a,b. An STI region 40 is formed proximate the pixel imager cell for isolating the cell 10 from an adjacent pixel cell. In operation, light coming from the pixel is focused onto the photodiode where electrons collect at the n-type region 20. When the transfer gate 25 is operated, i.e., turned on by applying a voltage to the transfer gate comprising, for example, an n-type doped polysilicon layer or conducting layer 70, the photo-generated charge 24 is transferred from the charge accumulating n-type doped region 20 via a transfer device surface channel 16 to the floating diffusion region 30, e.g., doped n+ type, as shown by arrow A.

While touted as providing increased surface area as compared to a flat photosensor element occupying a comparable area on a substrate, thus exhibiting a higher charge capacity and improved dynamic range, there are drawbacks, particularly, in the fact that this prior art photosensor cell of FIG. 1 teaches forming the charge collection region adjacent to physical boundaries such as trench walls, STI oxide structures, and the surface of the substrate.

Thus, a characteristic of these trench type CMOS imager photosensor devices is the existence of large dark current, i.e., leakage current, which discharges the pixel capacitance when there is no light over the pixel. The dark current measured at the pixel output depends on the photodiode, the transistors, and the interconnectivity in the pixel. None of the above-indicated prior art references teach isolating the charge collection region thus, and do not address dark current performance.

It would be highly desirable to provide a CMOS imager having the photodetector diode formed on the sidewall of a deep trench, resulting in collector isolation, and, a simplified process therefore.

It would be highly desirable to provide a CMOS imager having a photodetector diode formed on the sidewall of a deep trench, the photodiode thus exhibiting increased electron capacity by increasing the photodiode capacitance without adding to the cell size, or to the cell leakage.

SUMMARY

It thus an object of the invention to provide a CMOS image sensor having a photodetector diode formed on the sidewall of a deep trench, resulting in collector isolation, and, a simplified process therefore.

It is a further object of the invention to provide a CMOS imager having a photodetector diode formed on the sidewall of a deep trench, the photodiode having increased electron capacity by increasing the photodiode capacitance without adding to the cell size, or to the cell leakage.

According to one aspect of the invention, there is provided a pixel sensor cell comprising a non-lateral (e.g., vertical) collection region which is isolated from a physical boundary (e.g., substrate surfaces such as top surface or sidewalls/bottom of trench). In an embodiment of the invention, a trench is formed in a substrate of a first conductivity type (p type); a first doped layer of a second conductivity type (n type) is formed surrounding the trench walls to form a collection region; a second doped layer of the first conductivity type (p type) is formed between the first doped layer and the trench walls, and a third doped layer of the first conductivity type is formed on a surface of the substrate coupled to the second doped layer, wherein the second and third doped layers form a "pinning layer" for the sensor cell and isolate the collection region (e.g. first doped layer) from the trench walls and substrate surface.

Advantageously, the isolating of the deep trench photodiode collection region (e.g. first doped layer) from the trench walls and substrate surface of the pixel sensor cell enables improved dark current performance with the same or smaller pinning voltage.

A number of embodiments are described that include a pixel sensor cell structure having a semiconductor substrate having a surface; a photosensitive element formed in a substrate having a non-laterally disposed charge collection region, the non-lateral charge collection region being entirely isolated from a physical boundary including the substrate surface. The photosensitive element comprises a trench having sidewalls formed in the substrate of a first conductivity type material; a first doped layer of a second conductivity type material formed adjacent to at least one of the sidewalls; and a second doped layer of the first conductivity type material formed between the first doped layer and the at least one trench sidewall and formed at a surface of the substrate, the second doped layer isolating the first doped layer from the at least one trench sidewall and said substrate surface.

In a further embodiment, an additional photosensitive element is provided that includes a laterally disposed charge collection region including a layer of second conductivity type material that contacts the first layer of the second conductivity type material of the non-laterally disposed charge collection region of the first photosensitive element. This layer of second conductivity type material underlies the second doped layer of the first conductivity type material formed at the substrate surface.

In accordance with this further embodiment, the additional photosensitive element is formed adjacent a transfer gate device enabled for transferring charge carriers from both the laterally disposed charge collection region of the additional photosensitive element and charge carriers from the non-laterally disposed charge collection region of the photosensitive element across a gate channel to a formed diffusion region. The second conductivity type material of the first layer of the non-laterally disposed charge collection region of the photosensitive element is of a concentration such that the photosensitive element is fully depleted of accumulated charge carriers prior to depletion of charge carriers accumulated at the laterally disposed charge collection region of the additional photosensitive element.

According to another aspect of the invention, there is provided a method for fabricating a pixel sensor cell including a photosensitive element having a non-laterally disposed charge collection region. The method comprises:

a. forming a trench recess in a substrate of a first conductivity type material, the trench having sidewall and bottom portions;
b. filling the trench recess with a material having second conductivity type material;
c. outdiffuse second conductivity type material out of the filled trench material to the substrate region surrounding the trench sidewalls and bottom to form the non-laterally disposed charge collection region;
d. removing the filled trench material to provide the trench recess;
e. filling the trench recess with a material having a first conductivity type material;
f. forming a surface implant layer having first conductivity type material, the surface implant layer formed at either side of the trench,
g. wherein a collection region of the trench-type photosensitive element is formed of the outdiffused second conductivity type material and is isolated from the substrate surface.

A further step is performed whereby first conductivity type material is diffused out of the filled trench material to form a layer of first conductivity type material in a substrate region surrounding the trench sidewalls and bottom and between the non-laterally disposed charge collection region of the photosensitive element.

In a further embodiment, a second photosensitive element is formed having a charge collection region that is laterally disposed and abuts the non-laterally disposed charge collection region of the first photosensitive element. This step entails implanting second conductivity type material underneath the surface implant layer having the first conductivity type material, wherein the implanted second conductivity type material forms a charge collection region that is isolated from the substrate surface.

DESCRIPTION OF THE SEVERAL VIEWS OF THE DRAWINGS

The objects, features and advantages of the present invention will become apparent to one skilled in the art, in view of the following detailed description taken in combination with the attached drawings, in which.

DETAILED DESCRIPTION

Figure 2:
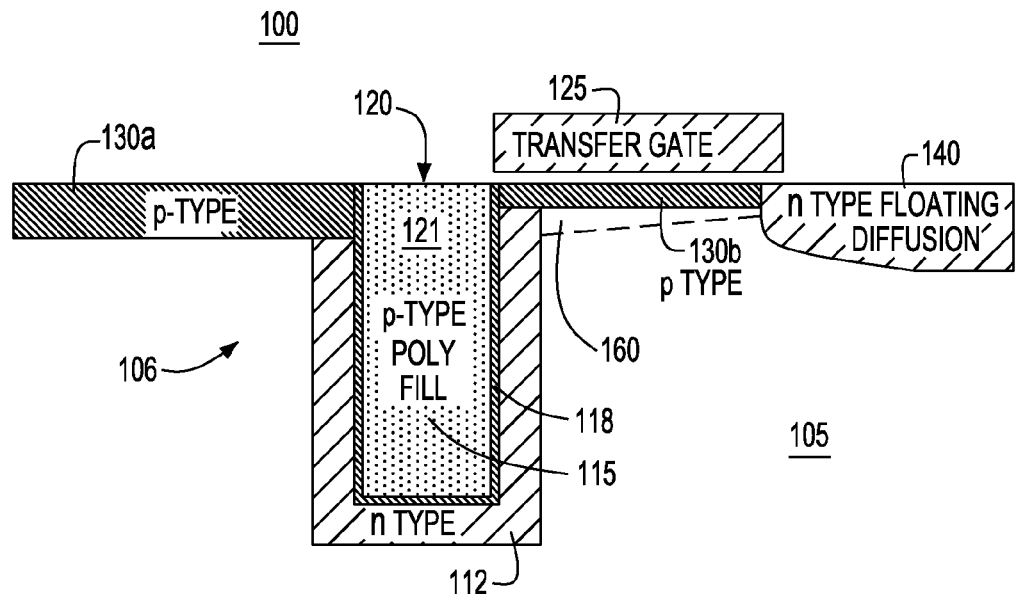
FIG. 2 depicts, through a cross-sectional view, one CMOS image sensor cell 100 including a photodiode element 120 according to a first embodiment of the invention.

FIG. 2 depicts, through a cross-sectional view, one CMOS image sensor cell 100 including a photosensor element 120 (e.g., photodiode) according to a first embodiment of the invention. While only a single CMOS image sensor cell 100 is depicted for exemplary purposes, it is understood that the pixel cell structure depicted is contemplated for inclusion in an array of pixels arranged in rows and columns with rows and columns of pixels addressable by pixel select circuitry not shown. Each cell in such an array of pixels may be isolated from an adjacent cell by a Shallow Trench Isolation (STI) structure not shown in the drawings.

As shown in FIG. 2, the CMOS image sensor cell 100 including the trench-type photodiode element 120 is formed on a semiconductor substrate 105 of a first conductivity type, typically p-type silicon. The substrate 105 however may be a bulk semiconductor including, for example, Si, SiGe, SiC, SiGeC, GaAs, InP, InAs and other III-V compound semiconductors, II-V compound semiconductors, or layered semiconductors such as silicon-on-insulators (SOI), SiC-on-insulator (SiCOI) or silicon germanium-on-insulators (SGOI). For purposes of description, substrate 105 is a Si-containing semiconductor substrate of a first conductivity type, e.g., lightly doped with p-type dopant material such as boron or indium (beryllium or magnesium for a III-V semiconductor), to a standard concentration ranging between, for example, $1e^{14}$ to $1e^{16}$ cm$^{-3}$.

The photosensor device itself, e.g., photodiode 120, comprises a trench structure 121 filled with first conductivity type material, e.g., p-type polysilicon 115, and includes a p-type dopant material outdiffused past the trench boundary forming a p-type boundary layer 118 surrounding the trench 121. A non-lateral (e.g. vertical) collection region, typically of a second conductivity type, e.g., n-type doped layer 112 is formed immediately adjacent and surrounding the p-type region 118. In operation, photocarriers are generated in a photoactive collection area 106 of the p-type substrate and are collected in the n-type region 112 surrounding the p-type polysilicon filled trench 121. The n-type doped region 112 surrounding the trench couples in to the transfer gate directly. That is, as shown in FIG. 2, formed adjacent to the photodiode element 120 is a transfer gate 125 that operates to transfer photo-generated charge from the charge accumulating n-type doped region 112 of photodiode element 120 through channel 160 to a floating diffusion region 140, e.g., doped n+ type as in current photosensor cell designs.

Referring to FIG. 2, characteristic of the photosensor (photodiode) element 120 of the invention is that the charge collection region 112 is isolated from a physical boundary such as, for example, the top substrate surface or sidewalls/bottom of trench surface. For instance, in the first embodiment of the invention, a p-type surface layer 130a,b is formed that functions as a pinning layer for the sensor cell and isolates the collection region 112 from surface boundaries. Moreover, the p-type dopant material outdiffused past the trench boundary and forming the p-type boundary layer 118 isolates the collection region 112 from the trench sidewall and bottom surface boundaries. As shown in the Figure, surface layer 130b is typically doped lower and shallower than 130a.

Figure 3:
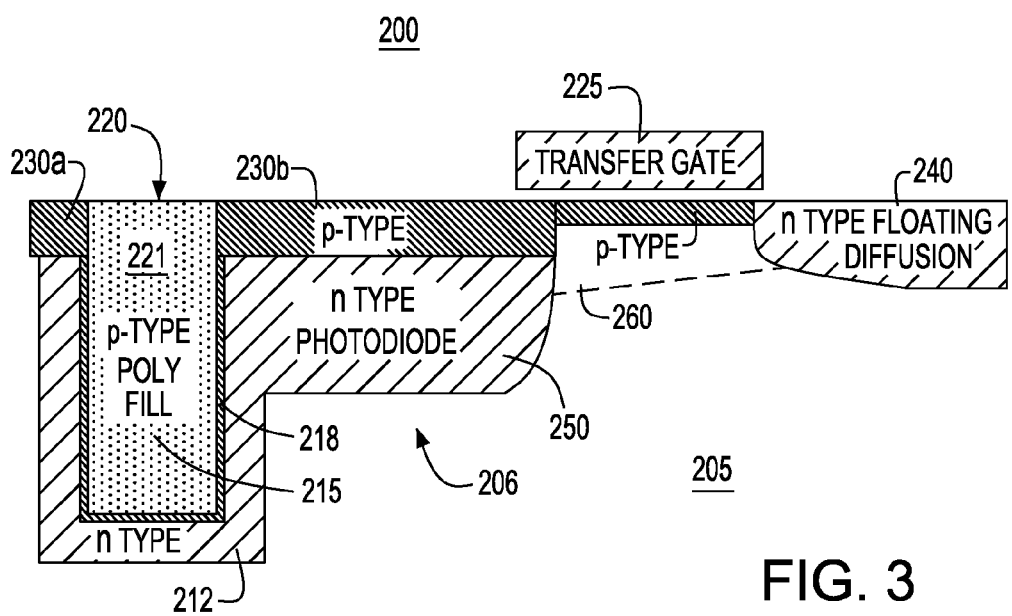
FIG. 3 illustrates, through a cross-sectional view, the CMOS image sensor cell 200 including a photodiode element 220 according to a second embodiment of the invention; and, FIGS. 4A-4H depict processing steps for forming the trench photodiode element according to the first embodiment of the invention.

FIG. 3 illustrates, through a cross-sectional view, the CMOS image sensor cell 200 including a photosensor element 220 (e.g., photodiode) according to a second embodiment of the invention.

While only a single CMOS image sensor cell 200 is depicted for exemplary purposes, it is understood that the pixel cell structure depicted is contemplated for inclusion in an array of pixels arranged in rows and columns with rows and columns of pixels addressable by pixel select circuitry not shown.

As shown in FIG. 3, the CMOS image sensor cell 200 includes a first conventional photodiode 250 and a second trench-type photodiode element 220 formed adjacent the photodiode 250. As shown in FIG. 3, the first conventional photodiode 250 is oriented laterally (horizontally) and abuts the trench-type photodiode element 220 such that a charge collection region of the conventional photodiode 250 connects to the charge collection region of the trench-type photodiode element 220. Both first lateral photodiode 250 and second trench-type photodiode element 220 are formed on a semiconductor substrate 205 of a first conductivity type, typically p-type silicon, as in the first embodiment and underlie a p-type surface layer 230a,b for enhanced isolation. As will be described in greater detail, the total capacitance of the sensor cell structure 200 according to the second embodiment of the invention is increased without increasing the area of the photodiode.

The second photosensor device itself, e.g., photodiode 220, comprises a trench structure 221 filled with first conductivity type material, e.g., p-type polysilicon 215, and includes a p-type dopant material outdiffused past the trench boundary forming a p-type boundary layer 218 surrounding the trench 221. A non-lateral (e.g. vertical) collection region, typically of a second conductivity type, e.g., n-type doped layer 212 is formed immediately adjacent and surrounding the p-type region 218.

In operation, photocarriers are generated in a photoactive collection area 206 of the p-type substrate and are collected both in the n-type doped region forming photodiode 250 and in the n-type region 212 surrounding the p-type polysilicon filled trench 221. The n-type doped region forming photodiode 250 couples its collected charge and charge collected from the n-type doped region 212 surrounding the trench to the transfer gate directly. That is, as shown in FIG. 3, formed adjacent to the photodiode element 250 is a transfer gate 225 that operates to transfer photo-generated charge from the charge accumulating n-type doped photodiode 250 and the charge accumulating n-type doped region 212 of photodiode element 220 through channel 260 to a floating diffusion region 240, e.g., doped n+ type as in current photosensor cell designs.

As in the first embodiment of the invention, characteristic of the photosensor (photodiode) element 220 of the second embodiment is that the charge collection regions 212 and 250 are isolated from a physical boundary such as, for example, the top substrate surface or sidewalls/bottom of trench surface. For instance, in the second embodiment of the invention, a p-type surface layer 230a,b is formed that functions as a pinning layer for the sensor cell and isolates the collection region 212, 250 from surface boundaries. As shown in FIG. 3, the depth of p-type layer 230b formed under the transfer gate is shallower than the remaining portion of the p-type layer 230b. Moreover, the p-type dopant material outdiffused past the trench boundary and forming the p-type boundary layer 218 isolates the collection region 212 from the trench sidewall and bottom surface boundaries. According to the second embodiment of the invention, the pinning potential is determined by photodiode parameters. Moreover, the trench photodiode element 220 is designed to be fully depleted before the lateral photodiode 250. That is, the doping level of the n-type charge collection region 212 is lower than the doping level of the n-type charge collection region of the lateral photodiode 250.

Figure 4A:
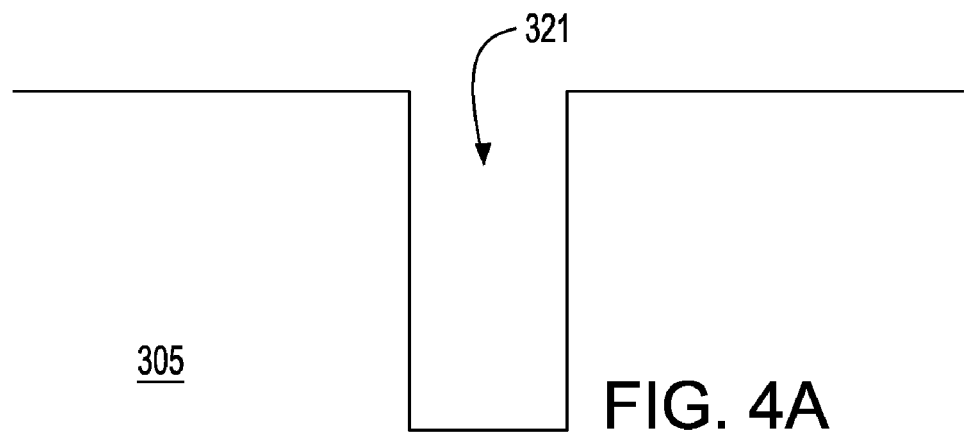
Figure 4B:
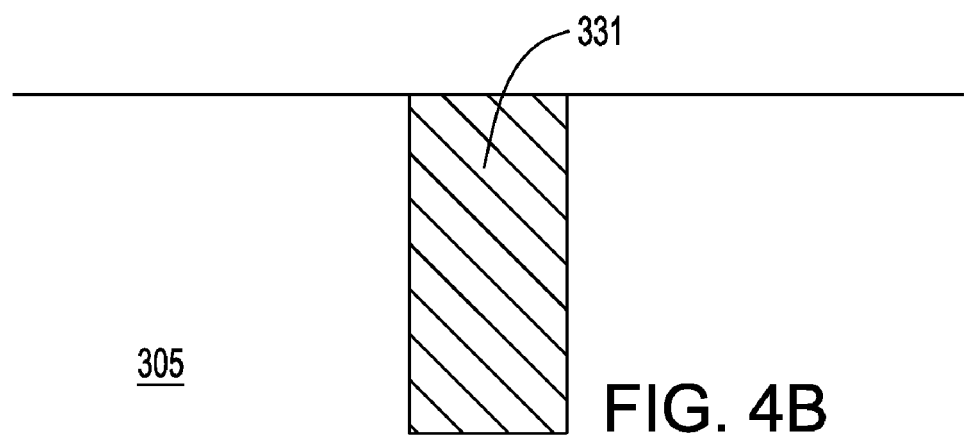

The method 300 to create the trench-type photodiode structures 120, 220 of the first and second embodiments of the invention is now described with respect to FIGS. 4A-4E. Generally, according to the method of the invention, as shown in FIG. 4A, a trench 321 is formed in a substrate of a first conductivity type (e.g., p-type). For purposes of description, substrate 305 is a Si-containing semiconductor substrate of a first conductivity type, e.g., lightly doped with p-type dopant material such as boron or indium (beryllium or magnesium for a III-V semiconductor), to a standard concentration ranging between, e.g., $1e^{14}$ atoms/cm$^3$ to $1e^{16}$ atoms/cm$^3$. Next, using standard processing techniques, the trench recess 321 is formed in the substrate. That is, utilizing a trench lithography, a photoresist mask (not shown) is applied, patterned and developed to expose an open region for forming a trench etch. Subsequently, an etch process, e.g., reactive ion etching, is performed through the opening in the mask to form the trench recess 321 that extends down below the substrate surface to a depth of about 0.2 ③m to 6 ③m. It is understood that the shape of the opened trench may be vertical (box like), or tapered, or "v"-like shaped. In a second step shown in FIG.

Figure 4C:
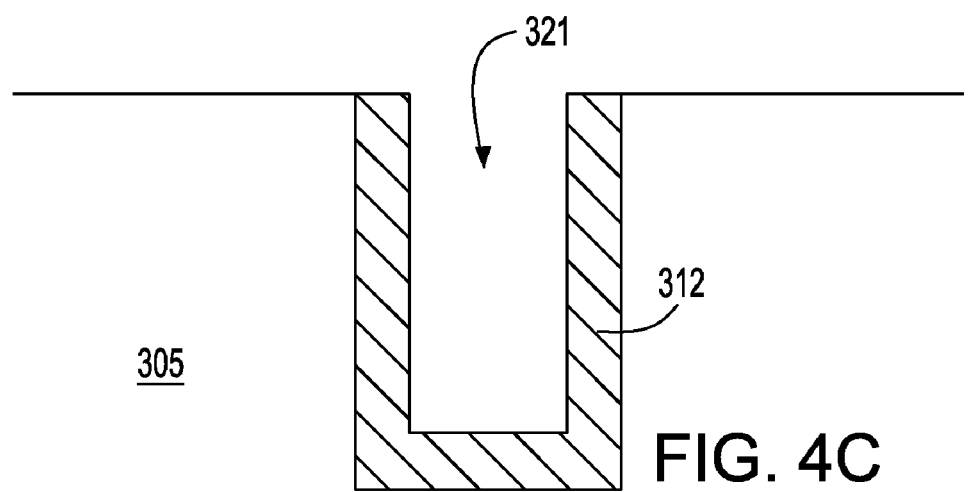
Figure 4D:
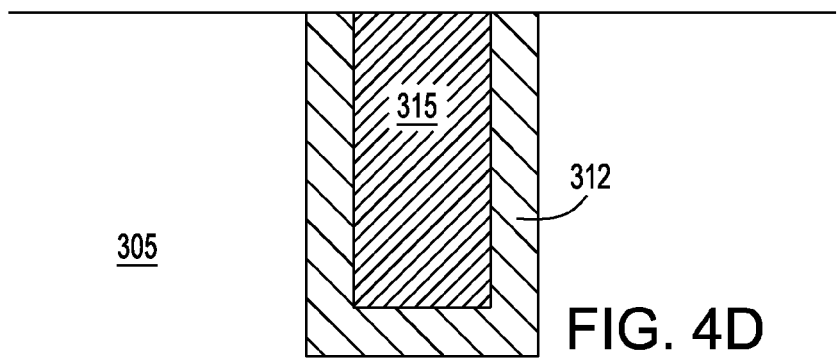

4B, the trench recess 321 is filled with a material 331 doped with material of a second conductivity type, e.g., n-type dopant material. For purposes of explanation, such a glass material may comprise PSG (phosphor silicateglass) for sourcing n-type doped material, and may be deposited within the trench by a well-known CVD process, or alternately a SOG, (spun on glass) process may be used. Subsequent to the deposition of n-type doped glass material, an etch-back or chemical-mechanical planarization technique is implemented to remove any excess PSG filler material and planarize the substrate surface. Then, as shown in FIG. 4C, a thermal treatment, e.g., anneal, is conducted at to drive out the n-type dopant from the glass source 331 into the trench walls. Particularly, the n-type impurity from the PSG trench fill 331 is outdiffused to the substrate region surrounding the trench sidewalls and bottom to form the n-type photocarrier collection region 312 of the resulting photodiode element. The n-type photocarrier collection region 312 ranges in thickness between 20 nm and 400 nm, and includes n-type carriers of a concentration ranging between $1 \times 10^{16}$ atoms/cm$^3$ and $1 \times 10^{18}$ atoms/cm$^3$. Subsequently, the PSG trench fill 331 is etched out, e.g., by a selective hydrofluoric acid (HF) etch, or potentially a fluorine based RIE (Reactive Ion Etch) process, or a combination of wet and dry processing, to result in the structure depicted in FIG. 4C. The now open photosensor device trench 321 is again filled this time with poly-Silicon in-situ doped with first conductivity type material, e.g., p-type polysilicon 315 with any excess poly-Si material 315 being planarized by CMP as shown in FIG. 4D.

Figure 4E:
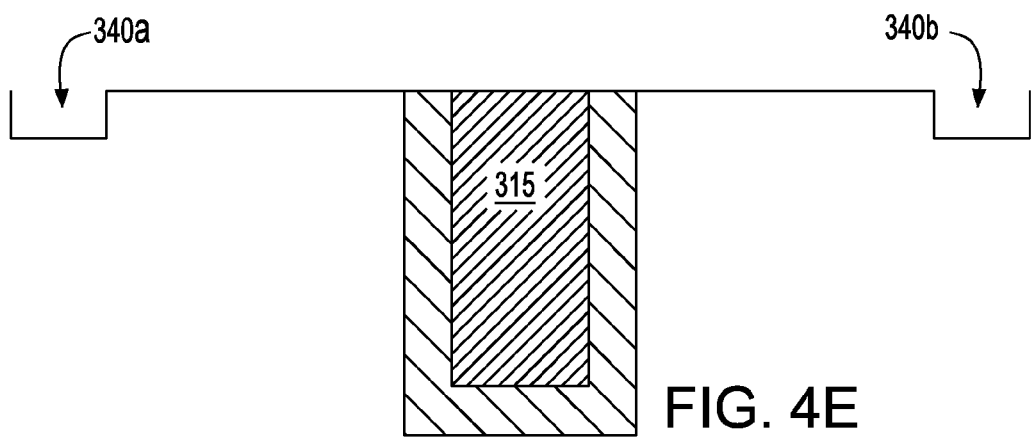
Figure 4F:
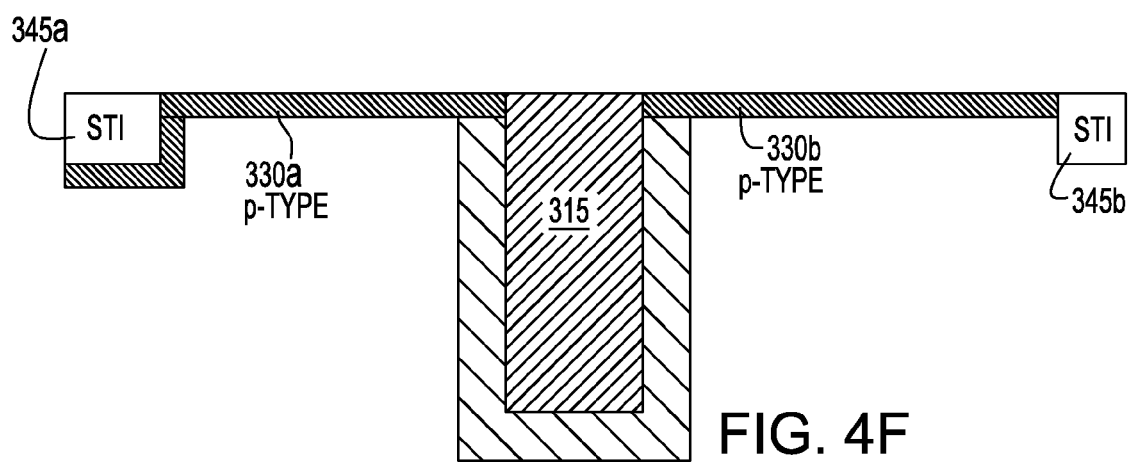
Figure 4G:
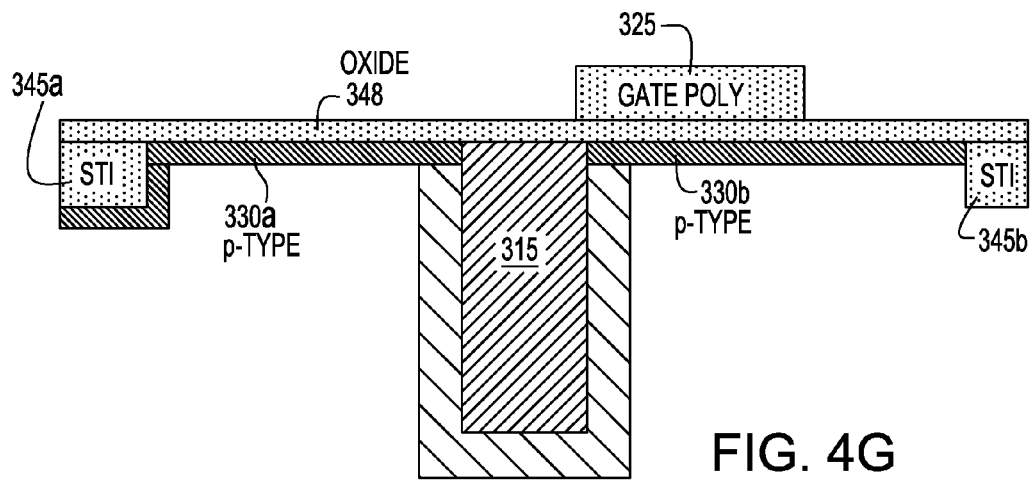
Figure 4H:
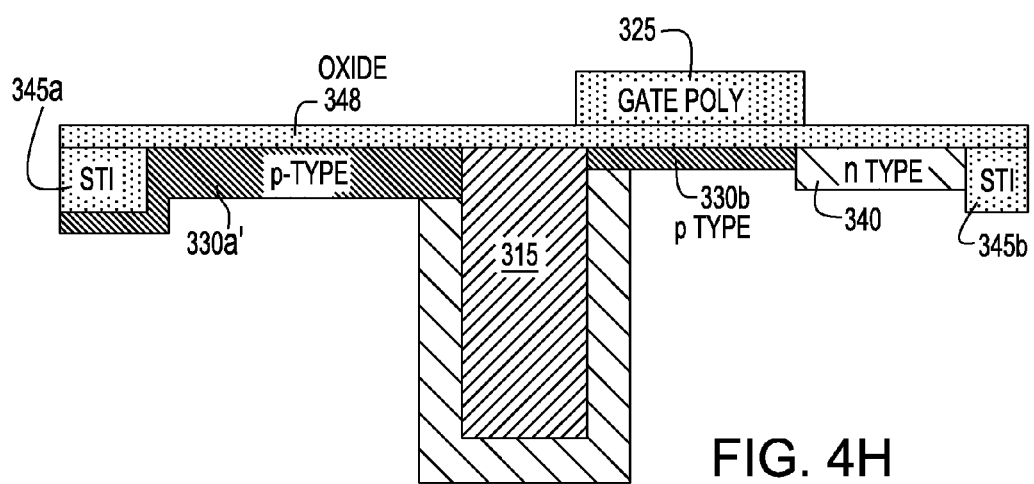

With respect to the first embodiment of the invention with just a vertical photodiode as depicted in FIG. 2, the processing continues as now described with respect to FIGS. 4E-4H. At this point, the unique vertical photodiode processing is now complete. The process now continues with stand CMOS processing with only a few exceptions. The process includes an isolation step e.g., forming trenches 340a, 340b to become (SROX or STI) isolation structures 345a, 345b, as shown in FIG. 4F followed by Nwell, Pwell implants and other well implants. Additionally formed are the p-type doped material layer 330a, 330b. For instance, a Vt tailor implant for the transfer gate comprises implantation of a p-type doped material to form layer 330b in FIG. 4F). Preferably, the dopant concentration for the Vt tailor implant for the transfer gate is typically greater than e16 cm$^3$). This is followed by the gate processing, the extension, and source/drain implants 340 as shown in FIG. 4H. At this point, typically in CMOS imager processing, the pinning layer implants are also performed.

Figure 1:
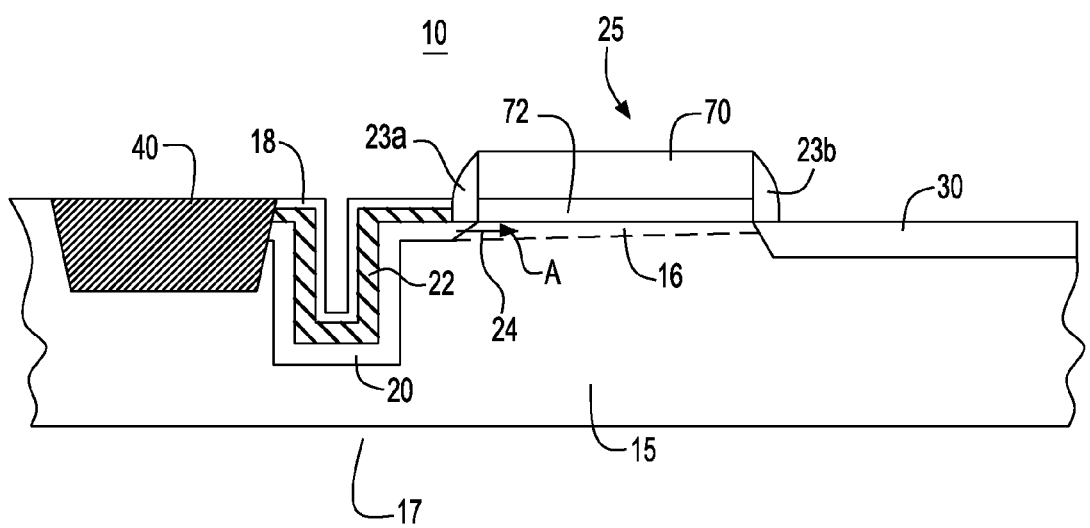
FIG. 1 illustrates, through a cross-sectional view, the CMOS image sensor 10 including a photodiode element according to the prior art.

Referring now to FIG. 4G, there is depicted in greater detail the resulting structure after surface processing and lithography steps for applying a surface oxide layer 348 (typically an oxide such as SiO$_2$ or like dielectric oxide, nitride or oxynitride) that will be suitably be patterned and etched to form the transfer gate dielectric, and a gate conducting layer or gate stack 325, e.g., of polysilicon material. As known, the transfer gate may comprise a doped layer or a conductive layer, e.g., doped polysilicon, tungsten or other suitable material over the insulating gate dielectric layer 72, e.g., silicon dioxide or silicon nitride, and may include insulating sidewall spacers 23a,b as shown in FIG. 1.

Referring now to FIG. 4H, there is depicted in greater detail an additional step of implanting p-type dopant material to the surface of the structure to form the p-type surface implant layer 330a', i.e., to keep electrons away from surface generation/recombination sites. This step is typically performed at (shortly before or after) the source/drain implant steps. This step entails implanting dopant material onto the substrate surface at openings formed in a prior photolithography step (not shown) corresponding to surface location indicated at 330a'. Preferably, p-type dopant material is implanted at suitable energies and concentrations to ensure electrical conductivity to the underlying lightly-doped substrate. The thickness of p-type surface layer 330a ranges between 10 nm and 200 nm and preferably has a concentration greater than $1 \times 10^{18}$ atoms/cm$^3$ to ensure that the collection region is isolated from the surface and subsequently formed transfer gate device.

Figure 5A:
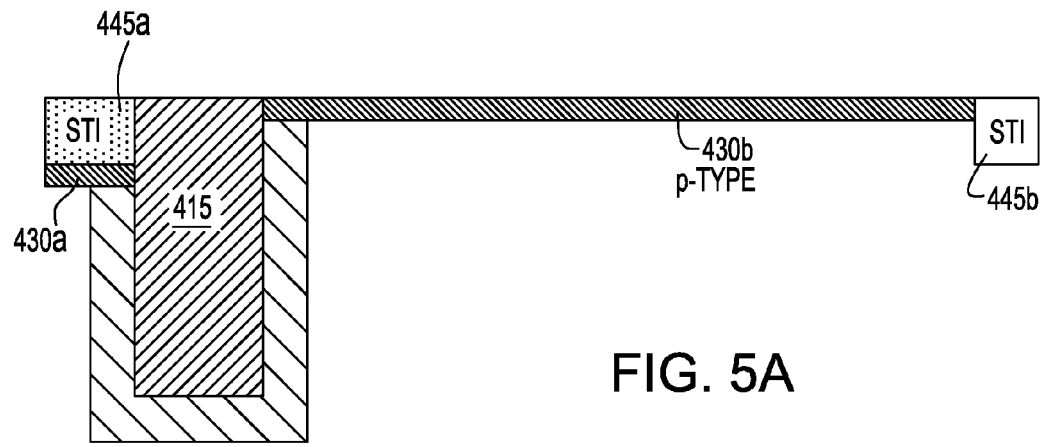
FIGS. 5A-5D depict processing steps for forming the trench photodiode element according to the second embodiment of the invention.
Figure 5B:
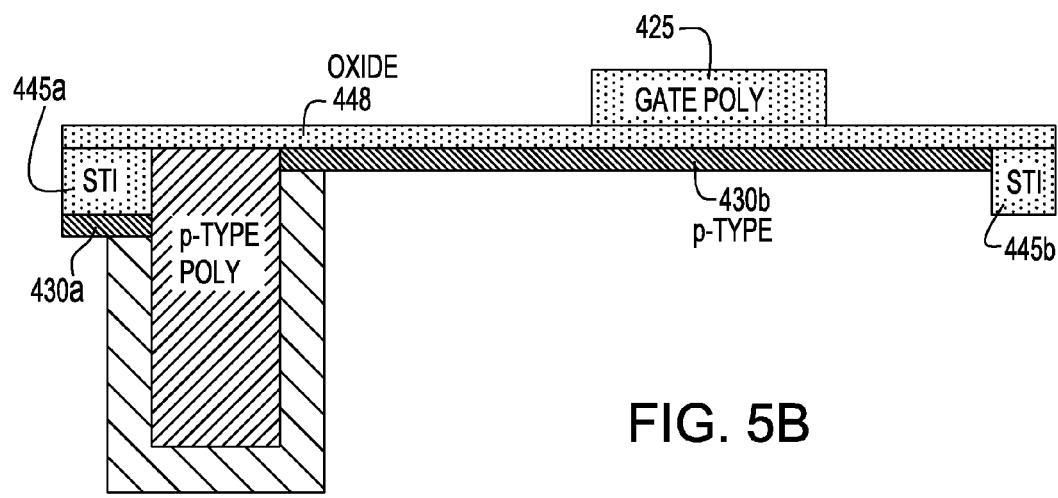
Figure 5C:
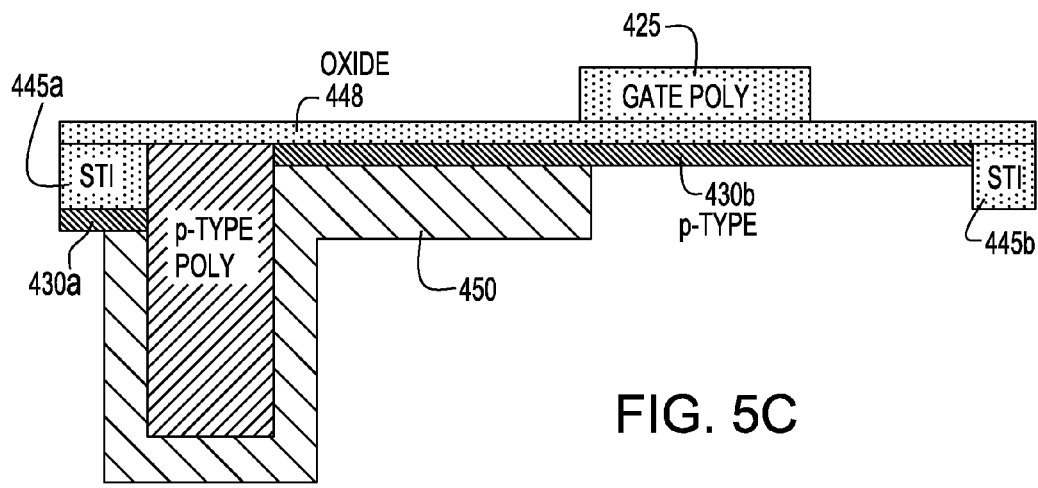
Figure 5D:
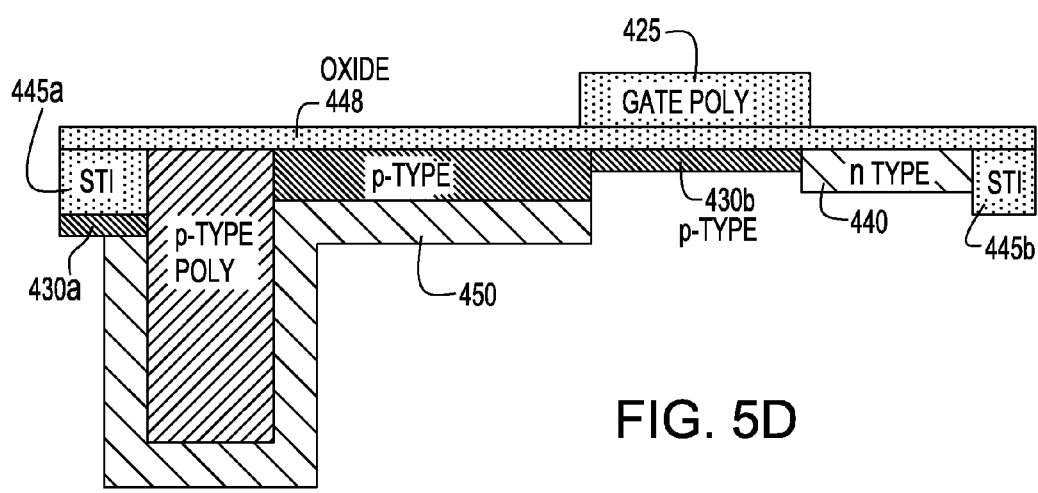

With respect to the second embodiment of the invention (depicted in FIG. 3) having both the lateral and vertical photodiodes, the resultant structure photosensor cell structure formed after applying similar processing steps such as described herein with respect to FIGS. 4E-4G is shown in FIGS. 5A and 5B. FIGS. 5A-5D particularly depict the method steps performed after the vertical photodiode processing (having polysilicon conductor 415) is complete. These steps include standard CMOS imager processing steps starting at the isolation level followed by the N photodiode implant, Nwell, Pwell, and other well implants, the gate processing, the extensions, source/drain implants, and the pinning layer implants etc. . . . as is done in a industry standard CMOS imager process flow. For example, as shown in FIG. 5A, there is depicted a resultant structure after forming the trench (e.g., STI) isolation structures 445a, 445b, and implantation of the p-type doped material layer 430a, 430b. For instance, a Vt tailor implant for the transfer gate comprises implantation of a p-type doped material to form layer 430b in FIG. 5A). Then, as shown in FIG. 5B, there is depicted the resulting structure after performing further surface processing and lithography steps for applying a surface oxide layer 448 (typically an oxide such as SiO$_2$ or like dielectric oxide, nitride or oxynitride) that will be suitably be patterned and etched to form the transfer gate dielectric, and a gate conducting layer or gate stack 425 of a doped layer or a conductive layer, e.g., doped polysilicon, tungsten or other suitable material over the insulating gate dielectric layer. The lateral photodiode and transfer gate processes would now proceed as in a standard CMOS imager process flow. Thus, as shown in FIG. 5C, the N photodiode implant 450 is depicted, as is depicted the extension, and source/drain implants 440 in FIG. 5D. At this point, typically in CMOS imager processing, the pinning layer implants are also performed It should be understood that in both first and second embodiments, the photodiode device is exposed to a suitable amount of temperature as a result of the thermal budgets employed during the subsequent CMOS imager processing flow at durations suitable to enable a second outdiffusion of the in-situ doped first conductivity type material, e.g., p-type polysilicon 315, to form an outdiffused p-type layer 118 (FIG. 2) and outdiffused p-type layer 218 (FIG. 3) of the respective photodiodes 100, 200 of the invention between the respective first n-type doped regions 112, 212 and the trench bottom/sidewalls. As shown in the embodiments of the invention depicted in FIGS. 2 and 3, the respective doped surface layers 130a, 130b and 230a, 230b of the first conductivity type formed on a surface of the substrate are coupled to the outdiffused p-type layers 118, 218 of the respective photodiodes 100, 200, such that they form a "pinning layer" for the sensor cell and isolate the collection region (e.g., first n-type doped layer) from the trench walls and substrate surface.

It is understood that the additional step of forming the second out-diffused layers 118, 218 of the respective photodiodes 100, 200 is such that the concentration of outdiffused first conductivity type (p-type) material in layers 118, 218 is greater than the concentration of the respective outdiffused second conductivity type (n-type) material forming the respective photocarrier collection regions 112, 212.

The benefits of the CMOS photosensor cell of the invention include: 1) increased cell capacity; 2) the ability to be fully depleted; 3) a pinned structure (no oxide interfaces with n-type dopant abutting); 4) reduced crosstalk (That is, the deep trench structure creates a lateral field deep in the silicon which preferentially collects charge generated close to this cell (and adjacent cells will collect their charge preferentially as well)); 5) no increase in cell area needed to get higher capacity (which would occur if capacity was designed to be increased by making the photodiode larger); 6) small increase in dark current (That is, dark current increase would be very large if capacity was designed to be increased by increasing dopant concentrations; and, 7) no change in pinning potential (which would occur if capacity was designed to be increased by increasing dopant concentration).

As mentioned, the total capacitance of the structure is increased without increasing the area of the photodiode. The pinning potential is still determined by the current photodiode parameters. In connection with the second embodiment of the invention, as depicted in FIG. 2, the trench photodiode 220 is of such n-type dopant concentrations and is suitably biased in operation to ensure that it becomes fully depleted before the lateral photodiode 250 becomes depleted, i.e., all electrons are driven out of the transfer gate of the deep trench photodiode 220. As is appreciated by skilled artisans, the n-type doped region 212 is fully depleted at a pinning voltage which is supplied by the floating diffusion through the transfer gate in order to cut down on dark current. The pinned photodiode is termed "pinned" because the potential in the photodiode is pinned to a constant value, Vp, when the photodiode is fully depleted.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A pixel sensor cell comprising:
a semiconductor substrate;
a transfer gate present on a portion of an upper surface of the semiconductor substrate;
a pinning layer of a first conductivity in the upper surface of the semiconductor substrate on a first side of the transfer gate and a floating diffusion region in the upper surface of the semiconductor substrate on a second side of the transfer gate;
a first photosensitive element including a trench present through the pinning layer into the semiconductor substrate on the first side of the transfer gate, wherein first photosensitive element includes a fill of the first conductivity within the trench and a charge collector region of a second conductivity being present entirely around the trench, wherein the charge collector region is isolated from a physical boundary including said upper surface by said pinning layer; and
a second photosensitive element in the semiconductor substrate on the first side of the transfer gate that abuts said first photosensitive element, wherein the second photosensitive element is present between the first photosensitive element and the transfer gate, and includes a laterally disposed collector region of the second conductivity underlying the pinning layer.

2. The pixel sensor cell of claim 1, wherein said transfer gate is enabled for transferring charge carriers from said laterally disposed collector region of said second photosensitive element and charge carriers from said charge collection region of said first photosensitive element across a gate channel to the floating diffusion region, said second conductivity type material of said first layer of said non-laterally disposed-charge collection region of said first photosensitive element is provided by a concentration such that said first photosensitive element is fully depleted of accumulated charge carriers prior to depletion of charge carriers accumulated at said laterally disposed collector region of said second photosensitive element.

3. The pixel sensor cell of claim 1, wherein the first conductivity is p-type and the second conductivity is n-type.

4. The pixel sensor cell of claim 1, wherein the first photosensitive element comprises a boundary layer of the first conductivity between the fill of the first conductivity and the charge collection region of the first photosensitive element.

5. The pixel sensor cell of claim 1, wherein the charge collection region of the first photosensitive element is a continuous region present in direct contact with sidewalls and base of the trench.

6. The pixel sensor of claim 1, wherein the floating diffusion region is of the second conductivity.

7. The pixel sensor of claim 1, wherein the pinning layer of a first conductivity is not present on the second side of the transfer gate.

8. A pixel sensor cell comprising:
a semiconductor substrate having an upper surface;
a pinning layer of a first conductivity underlying the upper surface of the substrate;
a first photosensitive element including a trench filled with a material of a first conductivity and a charge collection region of a second conductivity present around the entirety of the trench extending from the pinning layer, wherein the charge collector region is isolated from a physical boundary of said upper surface by said pinning layer;
a second photosensitive element abutting said first photosensitive element and underlying the pinning layer, said second photosensitive element having a laterally disposed collector region of the second conductivity that contacts the charge collection region of said first photosensitive element, wherein said laterally disposed collector region of the second photosensitive element and said charge collection region of the first photosensitive element are entirely isolated from a physical boundary of said upper surface of said semiconductor substrate by said pinning layer.

9. The pixel sensor cell of claim 8, wherein the first conductivity is p-type and the second conductivity is n-type.

10. The pixel sensor cell of claim 8, wherein the first photosensitive element comprises a boundary layer of the first conductivity between the material of the first conductivity and the charge collection region of the first photosensitive element.

11. The pixel sensor cell of claim 8, wherein the charge collection region of the first photosensitive element is a continuous region present in direct contact with sidewalls and base of the trench.

12. The pixel sensor cell of claim 8, wherein said second photosensitive element is formed adjacent a first side of a transfer gate device enabled for transferring charge carriers from said laterally disposed collector region of said second photosensitive element and charge carriers from said charge collection region of said first photosensitive element across a gate channel to a diffusion region on a side opposite the first side of the transfer gate device.

13. The pixel sensor of claim 12, wherein the second conductivity of said charge collection region of said first photosensitive element is provided by a concentration such that said first photosensitive element is fully depleted of accumulated charge carriers prior to depletion of charge carriers accumulated at said laterally disposed collector region of said second photosensitive element.

* * * * *